（12）United States Patent
Chan

(10) Patent No.: US 7,823,116 B2
(45) Date of Patent: Oct. 26, 2010

(54) HIERARCHICAL ANALOG LAYOUT SYNTHESIS AND OPTIMIZATION FOR INTEGRATED CIRCUITS

(75) Inventor: Shufan Chan, Anaheim Hills, CA (US)

(73) Assignee: SynCira Corporation, Cerritos, CA (US)

( * ) Notice: Subject to any disclaimer, the term of this patent is extended or adjusted under 35 U.S.C. 154(b) by 454 days.

(21) Appl. No.: 11/757,349

(22) Filed: Jun. 2, 2007

(65) Prior Publication Data

US 2008/0016483 A1  Jan. 17, 2008

Related U.S. Application Data

(60) Provisional application No. 60/831,613, filed on Jul. 17, 2006, provisional application No. 60/941,636, filed on Jun. 1, 2007.

(51) Int. Cl.
G06F 17/50 (2006.01)
(52) U.S. Cl. .......... 716/18; 716/5; 716/7; 716/11
(58) Field of Classification Search .......... 716/5, 716/7, 11, 18
See application file for complete search history.

(56) References Cited

U.S. PATENT DOCUMENTS 6,324,678 B1   11/2001  Dangelo
6,470,482 B1 * 10/2002  Rostoker et al. .......... 716/6
2003/0149859 A1  8/2003  Hyduke
2005/0172248 A1  8/2005  Shimada et al.
2005/0257178 A1  11/2005  Daems
2006/0080630 A1  4/2006  Lin

OTHER PUBLICATIONS

Chowdhury et al.,"Knowledge-Based Analogue VLSI Layout Synthesis", Nov. 1989, IEE Colloquium on Algorithmic and Knowledge Based CAD for VLSI, Paper Digest, pp. 11/1-11/6.*
Chen et al.,"Automatic Custom Layout of Analog ICs Using Constraint-Based Module Generation", 1991, IEEE Custom Integrated Circuits Conference, Paper Digest, pp. 5.5.1-5.5.4.*
Lin, "Incremental Mixed-Signal Layout Generation Concepts, Theory & Implementation", 2002, Department of Electrical Engineering, Eindhoven University of Technology, Netherlands, Ph. D. Disseration, one set.*
Hill, Jason Lester. "System Architecture for Wireless Sensor Networks". PhD Thesis, University of California Berkeley, Dept of Computer Science. Published May 2003. Internet: URL: http://www.jlhlabs.com/jhill_cs/jhill_thesis.pd>.

(Continued)

Primary Examiner—Sun J Lin
(74) Attorney, Agent, or Firm—Alford Law Group, Inc.; William E. Alford

(57) ABSTRACT

In embodiment of the invention, a method of synthesizing a layout of an integrated circuit chip including analog circuitry is disclosed. The method includes receiving a circuit netlist of an integrated circuit chip including analog circuitry; representing and manipulating a hierarchical analog circuit layout including device placement and net routing in response to the circuit netlist, the hierarchical analog circuit layout including a plurality of levels of layout hierarchy; and passing layout information from one level of the layout hierarchy to an adjacent level of the layout hierarchy to synthesize the layout of the integrated circuit chip.

15 Claims, 16 Drawing Sheets

OTHER PUBLICATIONS

International Search Report, Application No. PCT/US/07/73640, "Interactive Hierarchical Analog Layout Synthesis for Integrated Circuits" filed Jul. 16, 2007. Chan, Shufan.

Cohn,J; Garrod,D;Rutenbar,R.;Carley,L. "Analog Device-Level Layout Automation" Kluwer Academic Publishers. 1994. p. 1-285.

Rutenbar,R; Cohn,J. "Layout Tools or Analog ICs and Mixed -Signal SoCs: A Survey." ISPD. 2000.pp. 76-83.

Lampaert,K; Gielen,G; Sansen,W; "Analog Layout Generation for Performance and Manufacturability" Kluwer Academic Publishers. 1999. pp. 1-175.

Balkur,S; Dundar,G; Ogrenci,A; "Analog VLSI Design Automation" CRC Press. 2003. p. 1-218.

Gielen,G; Rutenbar,R; "Computer Aided Design of Analog and Mixed-Signal Integrated Circuits" IEEE. 2000. pp. 1825-1852.

Kubo, Y; Nakatake,S; Kajitani,Y; Kawakita,M. "Explicit Expression and Simultaneous Optimization of Placemtn and Routing for Analog IC Layouts." pp. 1-6.

Nojima,T; Zhu,X; Takashima,Y; Nakatake,S. Kajitani,Y. "MultiLevel Placement with Circuit Schema Based Clustering in Analog IC Layouts." IEEE. 2004. pp. 406-411.

Schnecke,V; Vornberger,O. "Hybrid Genetic Algorithms for Constrained Placement Problems." IEEE. 1998. pp. 1-14.

Prieto,J; Rueda,A; Quintana,J;Huertas,J. "A Performance Driven Placemeent ALgorithm with Simultaneous Place & Route Optimization for Analog IC's." ED&TC. 1997.pp. 1-6.

Abthoff,T; Johannes,F. TINA: Analog Placement Using Enumerative Techniques Capable of Optimizing Both Area and Net Length. EURO-DAC 1996. pp. 1-6.

Lin,Z; Huang,Y; Hsiau,K. "LAKE: A Performance-Driven Analog CMOS Cell Layout Generator." IEEE. 1994. pp. 564-569.

Bhattacharya,S; Jangkrajarng,N; Hartono,R; Shi,C. "Muti-Level Symmetry Constraint Generation for Retargeting Large Analog Layouts." UWEE. 2004.pp. 1-33.

Pillan,M; Sciuo,D. "Constraint Generation and Placement for Automatic Layout Design of Analog Integrated Circuits." 1994. pp. 355-358.

Zhang,L; Raut,R; Jiang,Y. "A Placement Algorithm for Implementation of Analog LSI/VLSI Systems." IEEE. 2004. pp. 77-80.

Office Action for U.S. Appl. No. 11/757,350; Paul Dinh, Apr. 19, 2010; 8 pages.

* cited by examiner

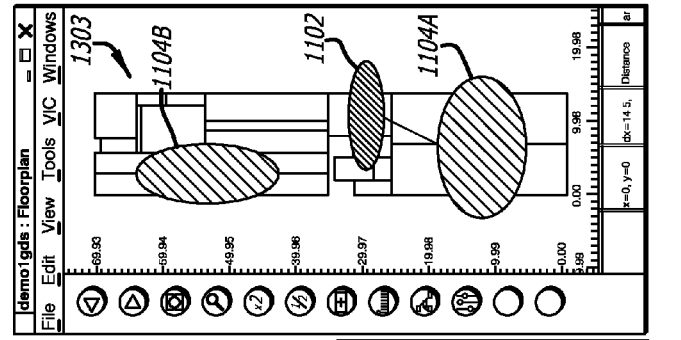
FIG. 12
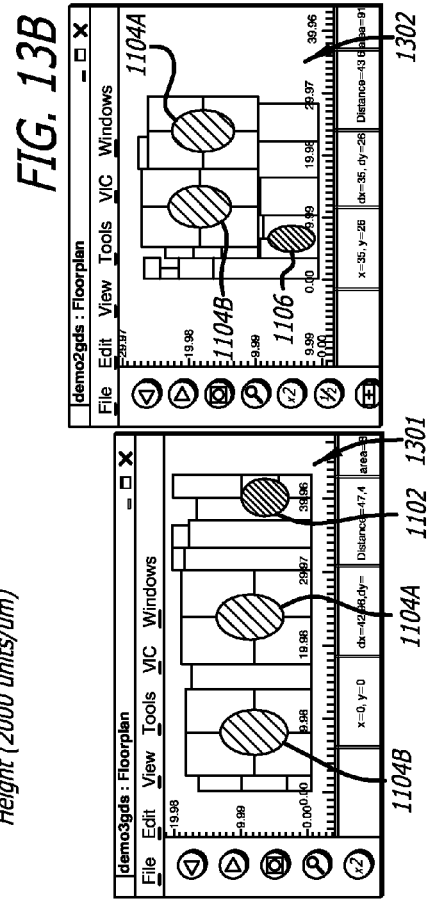
FIG. 13C
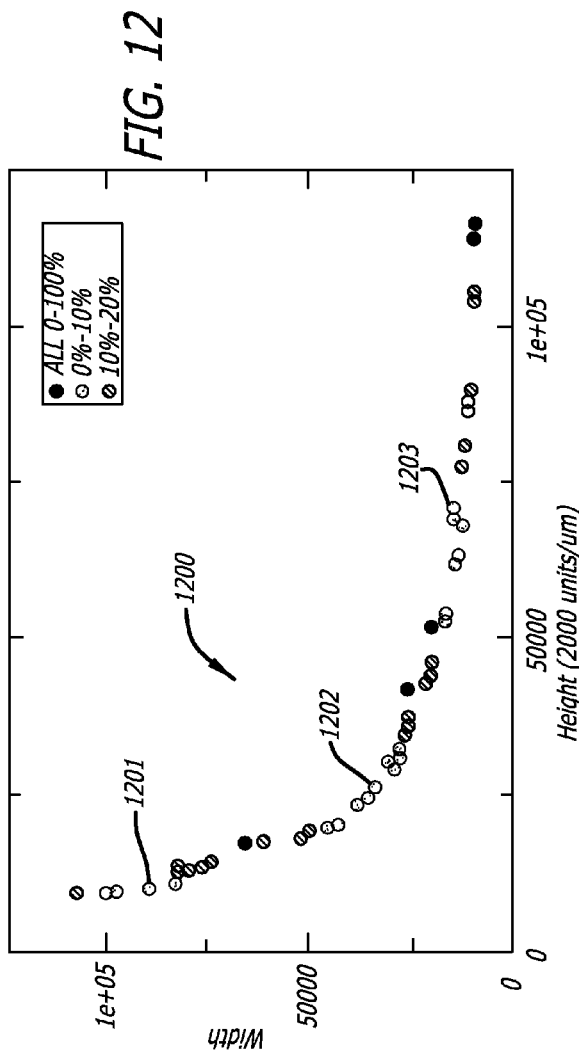
FIG. 13B
FIG. 13A

HIERARCHICAL ANALOG LAYOUT SYNTHESIS AND OPTIMIZATION FOR INTEGRATED CIRCUITS

CROSS REFERENCE TO RELATED APPLICATIONS

This non-provisional U.S. patent application claims the benefit of U.S. Provisional Patent Application No. 60/831,613 entitled HIERARCHICAL ANALOG LAYOUT SYNTHESIS AND OPTIMIZATION FOR INTEGRATED CIRCUITS filed on Jul. 17, 2006 by inventor Shufan Chan, and U.S. Provisional Patent Application No. 60/941,636 entitled INTERACTIVE ANALOG LAYOUT SYNTHESIS FOR INTEGRATED CIRCUITS filed on Jun. 1, 2007 which is incorporated herein by reference.

FIELD

The embodiments of the invention relate generally to the layout of analog circuitry to form mask works. More particularly, the embodiments of the invention relate to software tools for automated layout synthesis of analog circuitry in analog integrated circuits and mixed signal integrated circuits.

BACKGROUND

Analog circuit design differs from digital circuit design. Digital circuits prefer operating with binary numbers, a logical one or logical zero, represented by a pair of voltage levels—a logical high voltage level and a logical low voltage level or a digital signal. That is, a digital integrated circuit operates with discrete (binary) signals. The voltage levels between the logical high voltage level and the logical low voltage level were typically considered to be noise and usually unwanted in digital circuits. A digital integrated circuit typically utilizes the capabilities of Boolean logic gates to perform functions. Thus, the performance of a digital integrated circuit is less sensitive to placement, orientation, and the physical structure of transistor switches.

In contrast, analog circuitry operates using an analog signal over a range of voltages of an analog signal that can be between a maximum level and a minimum level. That is, an analog integrated circuit is an IC that operates with inter-module communication signals that are continuous rather than discrete. An analog integrated circuit has analog circuitry that exploits and utilizes the full spectrum of capabilities exhibited by individual low-level components, such as transistors, diodes, resistors, capacitors and inductors. The performance of an analog integrated circuit is very sensitive to the layout (placement, orientation, and physical pattern) of its low-level components. For example, noise immunity of an analog circuit and isolation of digital circuits from analog circuits can be important in the layout of analog circuitry.

Traditionally, analog circuitry has been manually laid out into its semiconductor mask layers for semiconductor manufacturing. This is because a human layout designer typically was experienced in analog circuit layout with prior knowledge, experience, and skill as to how the devices in an analog circuit were laid out so as to provide better performance and/or better noise immunity. The human layout designer could make choices up front prior to laying out the analog circuitry.

However, the number of choices that can be made up-front prior to layout are limited. Moreover, a human layout designer requires considerable time to layout an entire analog circuit chip or an entire mixed signal chip with both analog and digital circuitry. It is desirable to speed up the process of laying out analog circuitry, reduce the costs of designing analog circuits, and provide the capability of having additional choices in the criteria for an analog circuit layout.

BRIEF DESCRIPTIONS OF THE DRAWINGS

FIG. 12 illustrates an exemplary shape curve of a family of layout solutions made available by the embodiments of the invention for the schematic diagram of the comparator of FIG. 11.

FIGS. 13A-13C illustrate three exemplary floor-plans made available by the embodiments of the invention for the schematic diagram of the comparator of FIG. 11.

FIG. 16C illustrates a polish expression representation of the layout floorplan of FIG. 16A.

DETAILED DESCRIPTION

Figure 1:
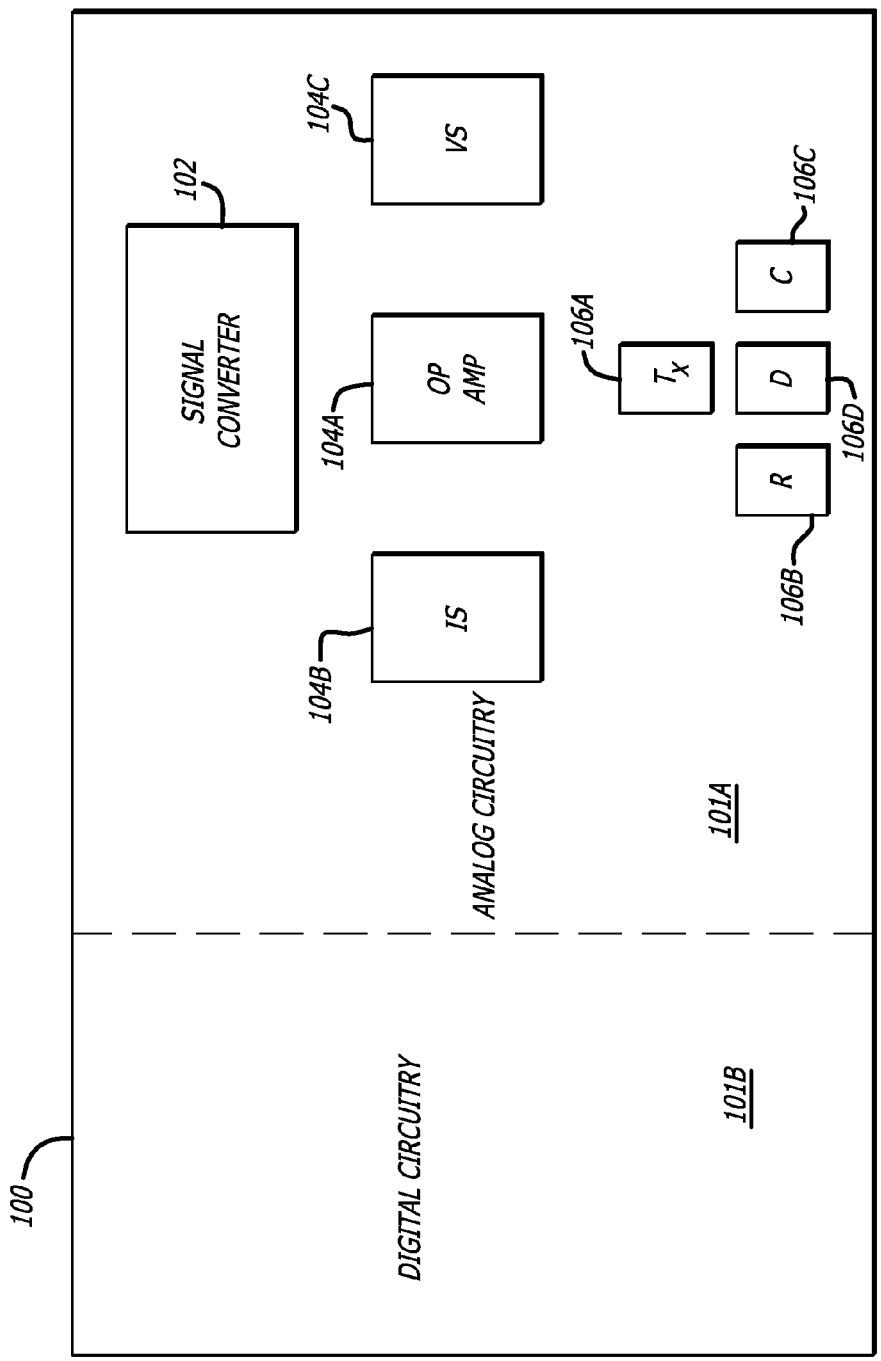
FIG. 1 is an integrated circuit including an analog circuit portion upon which embodiments of the invention may operate.

In the following detailed description of the embodiments of the invention, numerous specific details are set forth in order to provide a thorough understanding of the present invention. However, it will be obvious to one skilled in the art that the embodiments of the invention may be practiced without these specific details. In other instances well known methods, procedures, components, and circuits have not been described in detail so as not to unnecessarily obscure aspects of the embodiments of the invention.

Introduction

The embodiments of the invention include methods, apparatus, and systems for Hierarchical Analog Layout Synthesis and Optimization of Integrated Circuits.

The hierarchical analog layout synthesis (HALS) tool generates a semiconductor layout of an integrated circuit design that includes analog circuitry. It is capable of reading SPICE ("Simulation Program with Integrated Circuit Emphasis") netlists and generating hierarchical layouts of analog circuitry. The hierarchical analog layout synthesis tool performs the functions of partitioning, placement, and routing. The hierarchical analog layout synthesis tool coincidentally places and routes the analog circuitry.

During partitioning, transistors that are to be connected to each other may be grouped together and form an initial placement which is then routed with any adjustment in placement to complete the routing. Then, the placement and routing is optimized iteratively over a number of goals and objectives to generate multiple layouts for presentation to a user.

A user may give one or more directives to the HALS tool in order to specify certain constraints in the layout such as grouping certain devices together, spacing certain devices apart, or placing certain devices at specific locations of the layout.

The HALS tool provides global hierarchical layout optimization by generating multiple layouts for each layout hierarchy level. Given a set of layout optimizing criteria for the entire circuit, the HALS tool further provides a means of searching and retrieving from all levels of layout hierarchy, the one or more layout solutions satisfying the given layout criteria. The HALS tool accomplishes this by applying the concepts of multi-objective optimization and Pareto fronts to provide a hierarchical global analog circuit layout optimization. A hierarchical global analog circuit layout optimization is achieved by optimizing the entire layout at all levels of layout hierarchy, including any upper level of layout hierarchy and all lower levels of layout hierarchy.

A Pareto front and a "shape curve" (see the shape curve illustrated in FIG. 12) share similar features. A "shape curve" is a limited and degenerated case of a pareto front that has two objectives. That is, a shape curve is a plot of layout solutions for a cell, a subcircuit, or other level of circuit hierarchy with two objectives on X and Y axes. For example, one shape curve is a plot of a plurality of layout solutions with the criteria of circuit heights and circuit widths, such as illustrated in FIG. 12.

Referring now to FIG. 1, an integrated circuit design 100 is illustrated upon which embodiments of the invention may operate. The integrated circuit design includes an analog circuit portion 101A and a digital circuit portion 101B.

The hierarchical analog layout synthesis tool (HALS tool) may handle different levels of circuit hierarchy in an analog integrated circuit design. The levels of hierarchy in an analog integrated circuit design may include a top chip level, a mega block level, a macro block level, and a micro block level. An example of a mega-block is a signal converter 102, such as an analog to digital converter (ADC) or a digital to analog converter (DAC). Examples of macro-blocks include an operation amplifier (OPAMP) 104A, a current source (IS) 104B, and a voltage source (VS) 104C. Examples of micro-blocks include discrete semiconductor devices such as transistors 106A, resistors 106B, capacitors 106C, and diodes 106D.

As discussed previously, the hierarchical analog layout synthesis tool may handle different levels of hierarchy in an analog integrated circuit design. The hierarchy of an analog layout integrated circuit design may be further abstracted into a plurality of levels.

Figure 2:
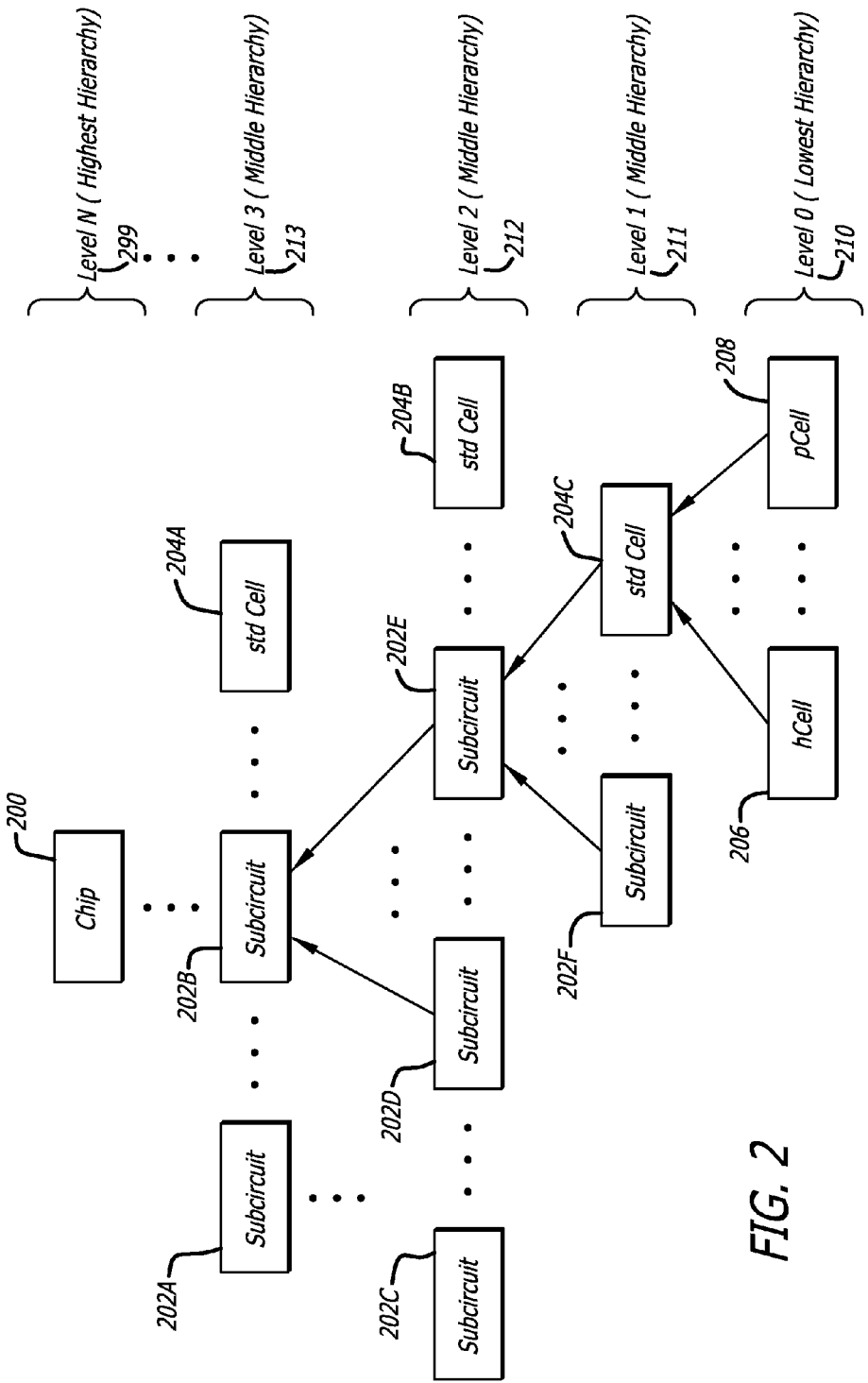
FIG. 2 is an exemplary diagram of circuit hierarchy of an integrated circuit chip upon which embodiments of the invention may operate.

Referring now to FIG. 2, a plurality of circuit hierarchy levels may be defined from a level 0 (a lowest level of hierarchy) 210 through to a level N (a highest level of hierarchy) 299 for an integrated circuit chip hierarchy.

At level N 299 of the layout hierarchy, the top or chip level 200 is a subcircuit at the highest level of layout hierarchy. The top or chip level 200 may be formed out of one or more levels of layout hierarchy as illustrated.

At middle levels of layout hierarchy, level 1 211 through level N−1 (not shown), one or more standard cells (stdcell) 204A-204C and/or one or more subcircuits 202A-202F may be found. A standard cell includes a pCell and/or an hCell which are defined below.

At the lowest level of layout hierarchy, level 0 210, one or more pCells and/or one or more hCells may be instantiated in the integrated circuit design. As previously discussed, pCell and/or an hCell may be included in a standard cell 204A-204C.

The pCells are circuit cells that are parameterizable cells having flexible cell heights and cell widths. Examples of pCells are transistor, resistor, and capacitor. The hCells are circuit cells that are hard cells having a fixed cell height and a fixed cell width. Examples of hCells are pre-laid circuit objects such as a memory block or memory cell.

Hierarchical Analog Layout Synthesis Tool and System

Figure 3:
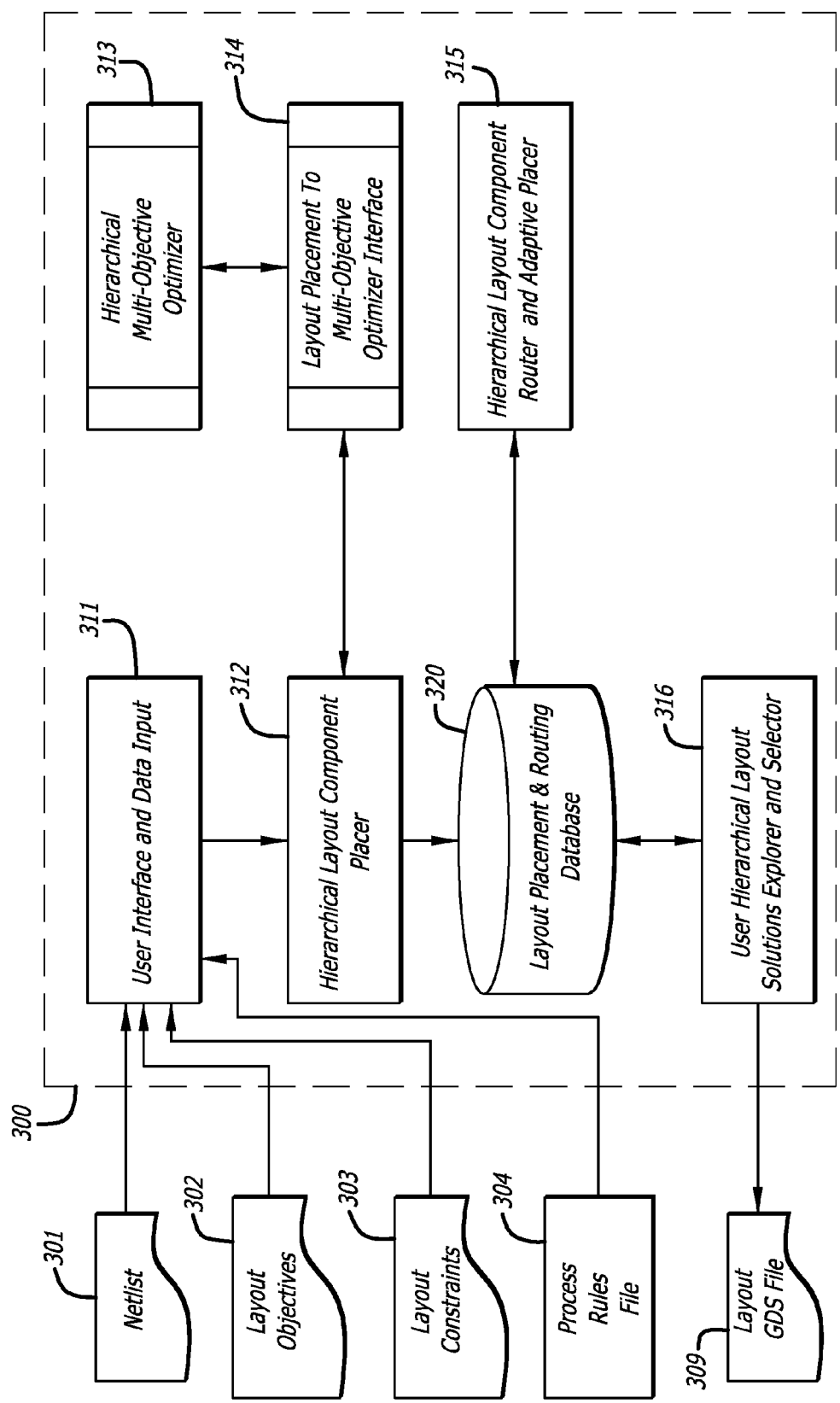
FIG. 3 is a functional block diagram of a hierarchical analog layout synthesis tool and system.

Referring now to FIG. 3, a functional block diagram of a hierarchical analog layout synthesis tool ("HALS tool") 300 and system are illustrated.

Figure 15:
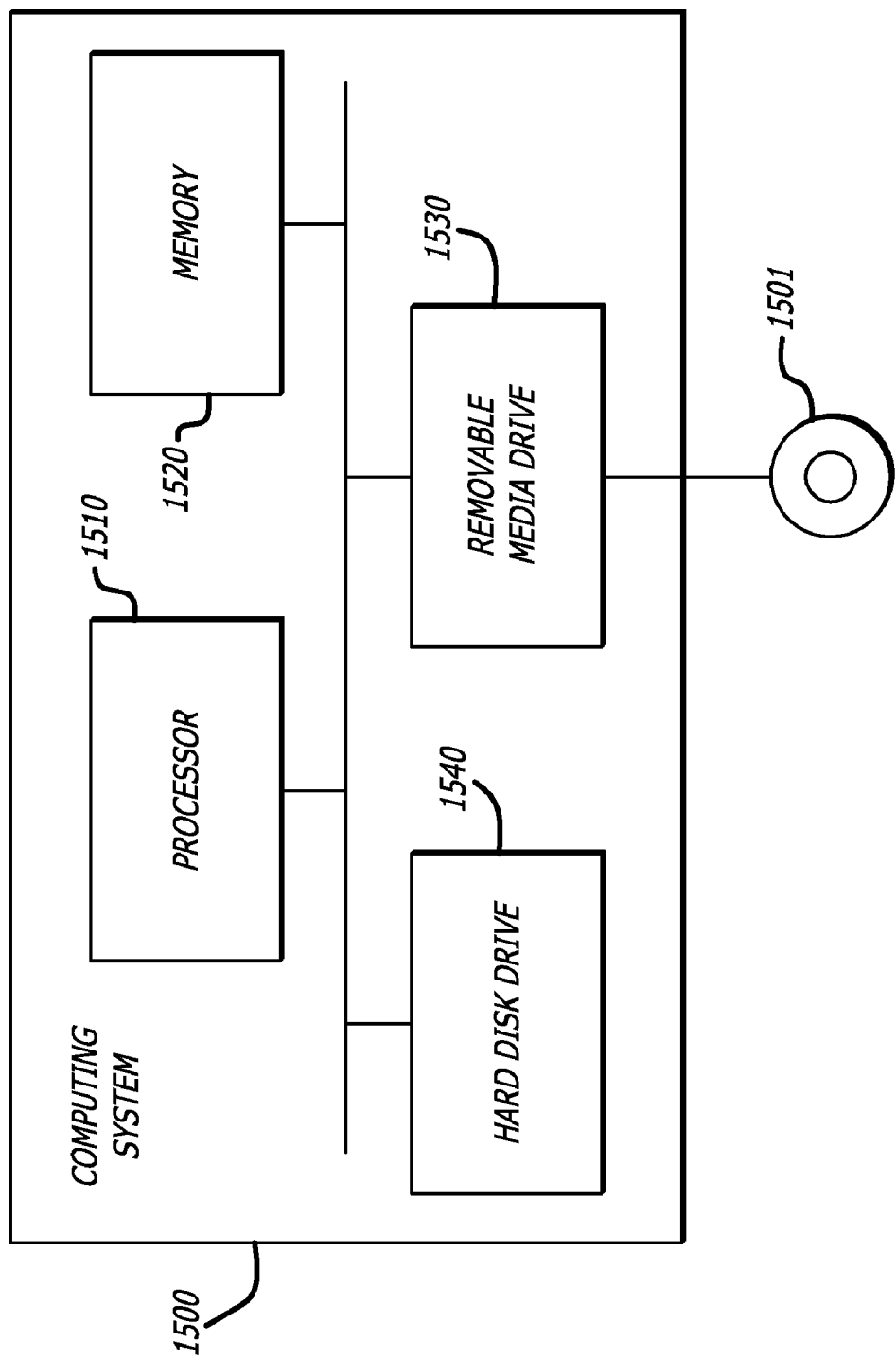
FIG. 15 illustrates an exemplary embodiment of a computing system usable with embodiments of the invention.

The HALS tool 300 is application software that is executable with an operating system (OS) on a computer system, such as that illustrated in FIG. 15. The HALS tool 300 receives a circuit netlist 301, layout objectives 302, layout constraints 303, and a process rules file 304. The layout objectives 302, layout constraints 303 and process rules file 304 and process rules file 304 may be collectively referred to as the layout synthesis directives and specifications.

The circuit netlist 301 is typically a spice transistor level netlist that includes a reference to the appropriate process specification that was utilized in its generation. The layout objectives 302 and layout constraints 303 may be user specified which are to be taken into account in generating a plurality of layout solutions. The process rules file 304 is a file containing the layout design rules for the targeted process of a wafer fabrication facility in which the semiconductor integrated circuit is to be manufactured.

The HALS tool 300 generates a selected optimized layout file 309 from a plurality of layout solutions to be output there-from. The layout file 309 may be in a GDSII file format, for example, including a plurality of mask layers to manufacture the semiconductor integrated circuit in a monolithic substrate.

The HALS tool 300 includes a user interface and data input reader 311, a hierarchical layout component placer 312, a hierarchical multi-objective optimizer 313, a hierarchical layout component router and adaptive placer 315, and a hierarchical layout solutions explorer and selector user interface 316 coupled together as shown. A layout placement to multi-objective optimizer software interface 314 may couple the hierarchical layout component placer 312 and the hierarchical multi-objective optimizer 313 together. The HALS tool 300 further includes an integrated analog layout placement and routing database 320 which is generated by the hierarchical layout component placer 312 and the hierarchical layout component router 315.

The hierarchical layout solutions explorer and selector user interface 316 reads the analog layout solutions that are in the database 320 and provides a user interface from which the one or more layout solutions may be analyzed and selected.

The user interface and data input reader 311 reads the user circuit data required for layout synthesis including the circuit netlist 301 and the layout synthesis directives (layout objectives 302, layout constraints 303) and specifications. The user interface and data input reader 311 may also read in layouts of the lowest level of layout hierarchy, such as the pCells and the hCells, or a prior subcircuit layout.

The hierarchical layout solutions explorer and selector user interface 316 and the user interface and data input reader 311 may be integrated into a single user interface by combining the functionality of each.

The integrated layout placement and routing database 320 is an internal database for data processing and input/output. The integrated layout placement and routing database 320 stores the plurality of layout solutions that are made available to the user through the hierarchical layout solutions explorer and selector user interface 316.

The hierarchical layout component placer 312 performs the initial placement of components (e.g., Transistors, diodes, resistors, capacitors, inductors, pCells, hCells, StdCells, subcircuits, etc.) in the layout at each level of hierarchy of the integrated circuit chip.

The hierarchical multi-objective optimizer 313 optimizes the placement of components (e.g., Transistors, diodes, resistors, capacitors, inductors, pCells, hCells, StdCells, subcircuits, etc.) using a multi-objective evolutionary algorithm described further below with reference to FIGS. 6-7.

The layout component placer to Multi-Objective Optimizer Interface 314 is a software module that interfaces between the hierarchical layout component placer 312 and the hierarchical multi-objective optimizer 313.

The hierarchical layout component router 315 coincidentally routes nets or the wire interconnect between levels and ports of the cells and subcircuits that were placed by the hierarchical layout component placer 312. A routing of a net or wire interconnect will almost always be made as the placement of the components will be adjusted to accommodate the routing. The hierarchical layout component router 315 is described further below with the description of FIG. 8.

The hierarchical layout solutions explorer and selector user interface 316 allows a user to browse through the plurality of layout solutions that are generated and make a selection based on certain criteria. The hierarchical layout solutions explorer and selector user interface 316 is described more fully below with the description of FIGS. 9,10A-10B.

Analog Circuit Synthesis Flow

Figure 4:
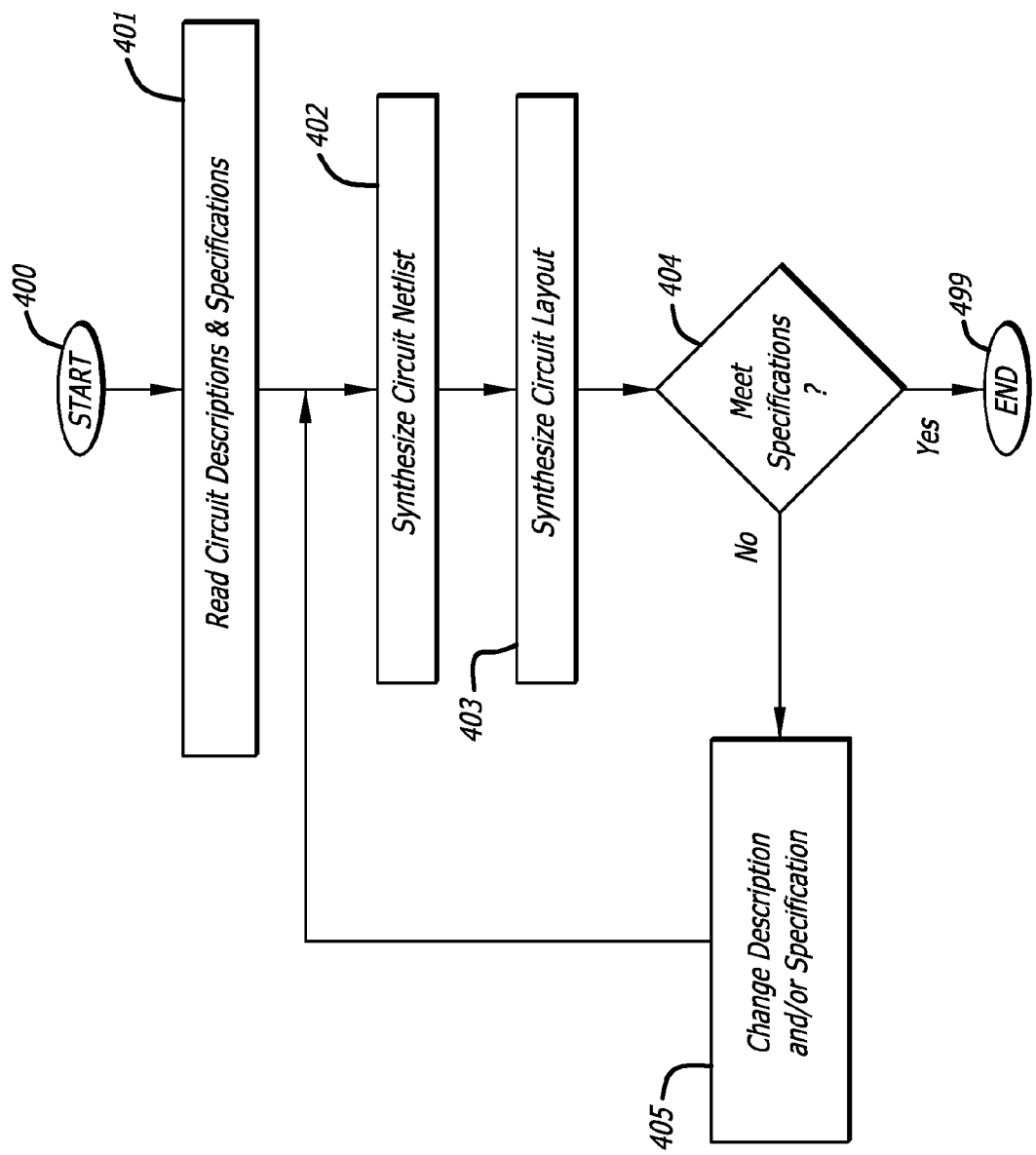
FIG. 4 is a flow chart diagram of analog circuit synthesis design flow including the synthesizing the circuit layout by the system and tool of FIG. 3.

Referring now to FIG. 4, a flow chart diagram of analog circuit synthesis design flow is illustrated, including the synthesis of the analog circuit layout by the system and tool of FIG. 3.

At block 401, the circuit descriptions and specification are determined and read. The process then goes to block 402.

At block 402, a circuit netlist is synthesized such as through the use of a spice circuit program. The process then goes to block 403.

At block 403, the HALS tool 300 synthesizes the analog circuit layout given the circuit netlist previously formed in the synthesis of the circuit netlist (block 402), and the circuit descriptions and specification read in block 401.

At block 404, a determination is made as to whether or not the specifications for the analog circuit were met. If so, the process goes to block 499 and ends. If the specifications for the analog circuit were not met, the process goes to block 405.

At block 405, the circuit description and/or circuit specifications are changed if the layout does not meet the initial specifications. If the circuit specification and/or description are changed, then the process goes back to block 402 and the circuit netlist and layout are re-synthesized.

Figure 5:
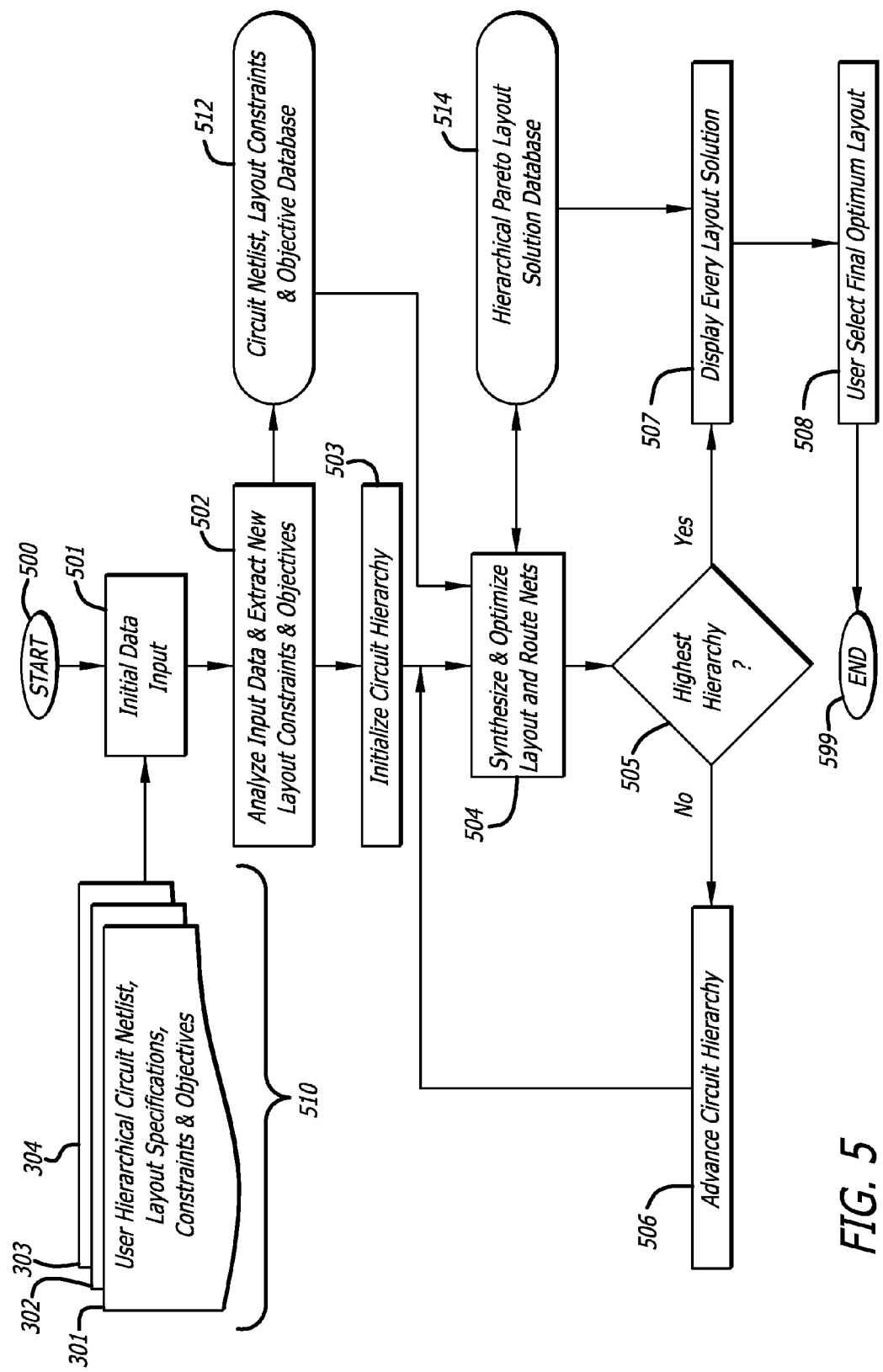
FIG. 5 is a system flow chart diagram of the hierarchical analog layout synthesis and optimization performed by the system and tool of FIG. 3.

Referring now to FIG. 5, a system flow chart diagram of the hierarchical analog layout synthesis and optimization performed by the system and tool of FIG. 3 is illustrated.

The layout synthesis and optimization starts at block 500 and then goes to block 501.

At block 501, initial data input 510 is coupled into the IC design software (HALS tool 300), such as the User Hierarchical Circuit Netlist 301, the user Layout Specifications 303, initial user constraint and objectives 302, and process rules file 304. The user interface 311 in the HALS tool 300 receives the initial data input 510. The process then goes to block 502.

At block 502, the initial data input is analyzed and new/additional layout constraints and objectives are extracted. This is performed by the user interface 311 of the HALS tool 300. The user's circuit netlist and new/additional layout constraints and objectives are stored into the database 512 that will be later used to synthesize and optimize the layout.

At block 503, the circuit hierarchy is initialized. The initial circuit hierarchy is extracted from the user's circuit netlist.

At block 504, given the initial circuit hierarchy and the Circuit Netlist, Layout Constraints and Objective Database 512; the analog layout is synthesized and optimized at block 504. During this process, the initial circuit hierarchy is mapped into appropriate levels of hierarchy in accordance with the exemplary hierarchy of FIG. 2, described previously. The analog layout is synthesized, optimized, and the wire nets routed at block 504 by the hierarchical layout component placer 312, the hierarchical multi-objective optimizer 313, and the hierarchical layout component router and adaptive placer 312 illustrated in FIG. 3. This process generates a hierarchical Pareto layout solutions database 514 that includes a plurality of layout solutions for the analog integrated circuit.

The database 514 storing the layout solutions and the database 512 storing the user's circuit netlist and new/additional layout constraints and objectives may be part of the layout placement and routing database 320.

Next at block 505, a determination is made if the layout that was just synthesized and optimized at block 504 was at the highest level of hierarchy in the integrated chip hierarchy. If the highest level of integrated chip hierarchy was synthesized and optimized at block 504, the process goes to block 507. If the highest level of integrated chip hierarchy was not synthesized and optimized at block 504, the process goes to block 506.

At block 506, the level of circuit hierarchy is advanced to the next higher level of integrated circuit chip hierarchy. The process then goes to block 504 and synthesizes and optimizes the layout at the next higher level of circuit hierarchy. The process continues in the loop of blocks 504-506 until the highest level of hierarchy is reached and the process goes to block 507.

At block 507, assuming that the highest level of layout hierarchy of the desired circuit was synthesized and optimized, every layout solution that is generated by the HALS tool 300 is displayed to the user by means of the layout solutions user interface 316.

Then at block 508, the user may select the final optimum layout by means of the layout solutions user interface 316. The process then goes to block 599 and ends.

Circuit Partitioning and Placement Using Moea Methods

Figure 6:
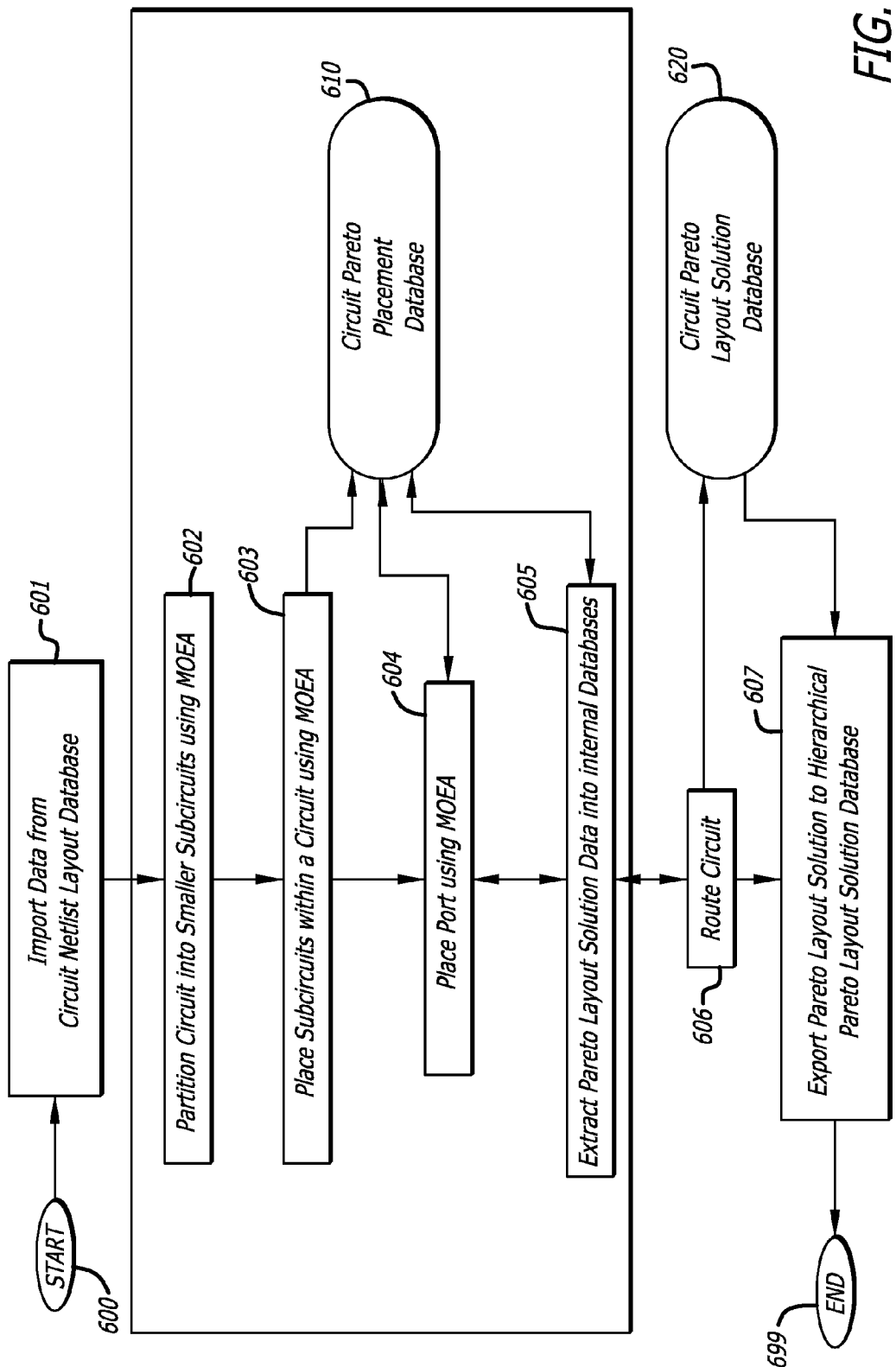
FIG. 6 is a more detailed flow chart diagram of the analog layout synthesis and analog layout optimization performed by the system and tool of FIG. 3.

Referring now to FIG. 6, a synthesis and optimization layout flowchart is illustrated. The synthesis and optimization of the layout begins at block 600 and then goes to block 601.

At block 601, data from the Circuit Netlist Layout Database 512 is imported to begin synthesizing and optimizing the layout.

At block 602, the circuit is partitioned into smaller subcircuits using a multi-objective evolutionary algorithm (MOEA). The MOEA is generally described below with reference to FIG. 7.

At block 603, sub-circuits are placed within a circuit using the MOEA criteria. This forms part of the Circuit Pareto Placement Database 610. The MOEA is generally described below with reference to FIG. 7.

At block 604, the ports of the circuit and sub-circuits are placed using the MOEA. The port placement also forms part of the Circuit Pareto Placement Database 610. The MOEA is generally described below with reference to FIG. 7.

At block 605, Pareto Layout Solution Data is extracted into internal databases, such as the Circuit Pareto Placement Database 610. This allows other software components of the HALS tool 300 to gain access.

At block 606, the circuit is routed to generate the Circuit Pareto Layout Solution Database 620. During routing by the hierarchical layout component router 315, the hierarchical layout component router 315 may be invoked to change the placement of the subcircuits within a circuit as well as the placement of the ports. That is, if the initial routing was not successful, the process may go back and repeat blocks 603-605 and update the circuit pareto placement database 610. Otherwise if the initial routing was successful, the layout is generated and added to the Circuit Pareto Layout Solution Database 620.

Next at block 607, the Pareto Layout Solutions are exported to the Hierarchical Pareto Layout Solution Database 514 and then the process goes to block 699 and ends.

The Circuit Pareto Placement Database 610 and the Circuit Pareto Layout Solutions Database 620 may also be part of the layout placement and routing database 320.

In the automatic laying out of analog circuitry, circuit partitioning, device/subcircuit placement, and port placement may all be considered to be multi-objective evolutionary algorithm (MOEA) problems that have a Pareto solution. The following discussion introduces the constraints and objectives forming the multiple objectives, the measures of fitness of the solutions, and the representation of the Pareto solution to each of these problems.

A) Circuit Partitioning as an MOEA Problem

In the process 602 of circuit partitioning a circuit netlist into smaller subcircuits, the Pareto solution representation is a sets of devices that are to be laid-out together at a level of the integrated circuit chip hierarchy.

The measure of fitness (or objectives) of the circuit portioning can be any mathematical relationship among different layout metrics and typically are (i) the cost of having devices separated into different sets and (ii) the cost of having multiple sets of devices.

The constraints of the circuit portioning can be any mathematical relationship among different layout metrics and typically are (i) the maximum number of sets and (ii) the minimum number and the maximum number of devices per set.

B) Device/Subcircuit Placement as an MOEA Problem

In the process 603 of device/subcircuit placement into a circuit layout, the placement representations are floorplans described as polish expressions (see FIGS. 16A, 16C); devices or subcircuits (of different layout aspect ratio) as operands; device or subcircuit placements as the operators at a level of the integrated circuit chip hierarchy.

Figure 16A:
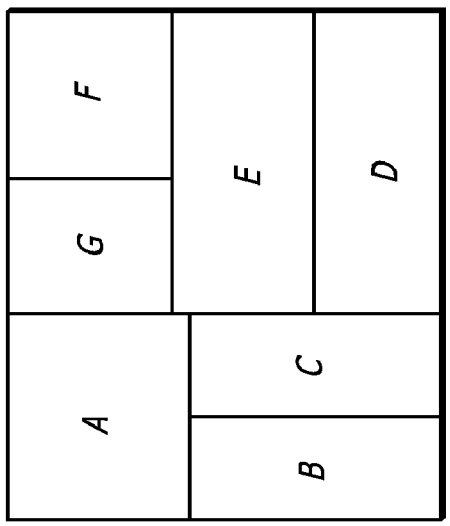
FIG. 16A illustrates a layout floorplan for an integrated circuit.
Figure 16B:
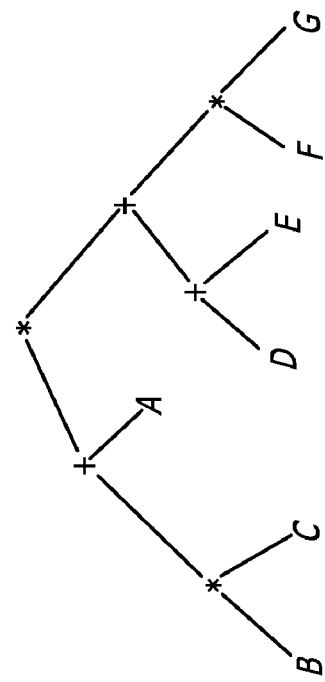
FIG. 16B illustrates a slicing tree representation for the layout floorplan of FIG. 16A.

Referring momentarily to FIGS. 16A-16C, FIG. 16A illustrates a layout floorplan for an integrated circuit. The layout floorplan includes floorplan slices A-G. The floorplan slices A-G may also be referred to as blocks.

FIG. 16B illustrates a slicing tree representation for the layout floorplan of FIG. 16A. The floorplan slices A-G are combined together by the operators*and+into the top chip level.

FIG. 16C illustrates a polish expression representation of the layout floorplan of FIG. 16A. The polish expression representation of the layout floorplan illustrated in FIG. 16C also corresponds to the slicing tree representation of the layout floorplan of FIG. 16B. The floorplan slices A-G are the operands in the polish expression representation of the layout floorplan. The operators*and+combining the floorplan slices A-G together are the operators in the polish expression representation of the layout floorplan.

Figure 11:
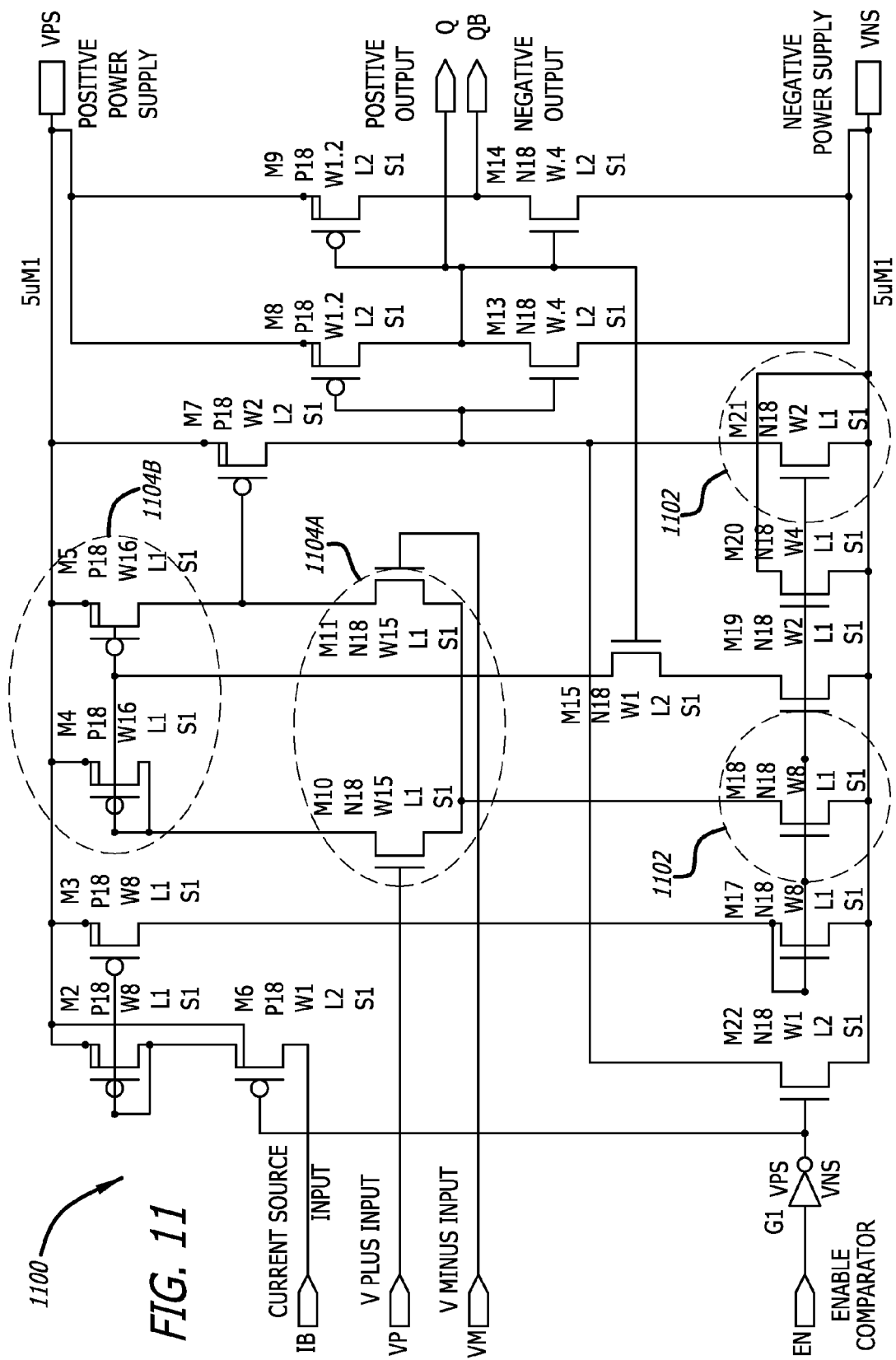
FIG. 11 illustrates an exemplary schematic diagram of an comparator to explain the plurality of layout choices that are made available to a user.

Referring momentarily to FIG. 12, a shape curve for the subcircuit of the comparator illustrated in FIG. 11 having different layout aspect ratios of subcircuit height and subcircuit width.

The measures of fitness (or objectives) of the of Device/Subcircuit Placement into a circuit layout can be any mathematical relationship among different layout metrics and typically are (i) the cost of unused space between placed device or subcircuit; (ii) the height and the width of the floorplan; and (iii) the wire length and the wire jogging between connecting devices or subcircuits.

The constraints of Device/Subcircuit Placement into a circuit layout can be any mathematical relationship among different layout metrics and typically are (i) relative device-to-device (device-to-subcircuit or subcircuit-to-subcircuit) placement criteria, and (ii) relative device-to-floorplan (subcircuit-to-floorplan) placement criteria.

C) Port Placement as an MOEA Problem

In the process 604 of port placement for the devices/subcircuits in the circuit layout, the port placement representations are an integer string of subcircuits or devices; an integer value represent a flipping operator at a level of the integrated circuit chip hierarchy. The flipping operator controls the orientation of the subcircuit or devices; and hence controls the port location of the subcircuit or device.

The measure of fitness (or objectives) of the Device/Subcircuit Placement into a circuit layout is typically the wire length between connecting subcircuits or devices.

There typically are no constraints on the port placement for the devices/subcircuits in the circuit layout.

Figure 7:
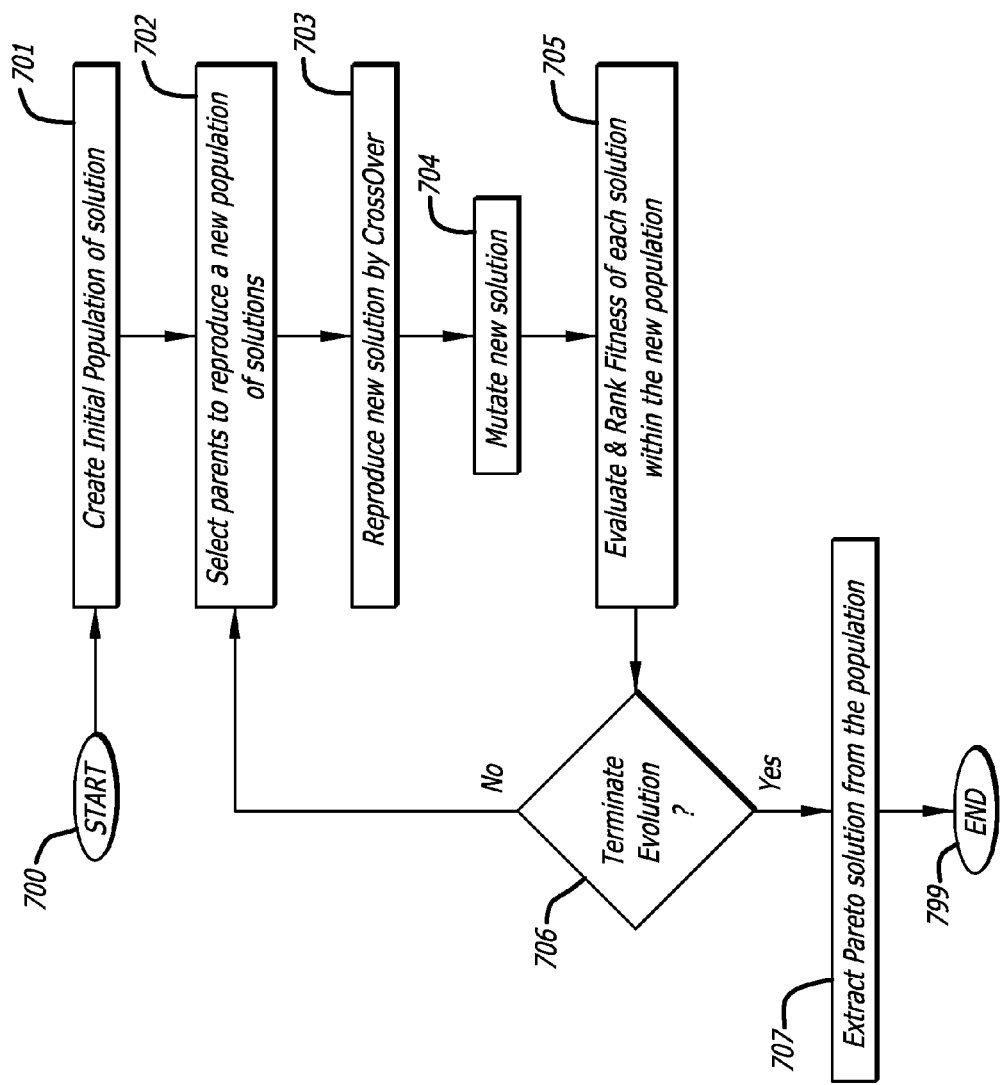
FIG. 7 is a flow chart diagram of the multi-objective evolutionary algorithm (MOEA) performed by the system and tool of FIG. 3.

Referring now to FIG. 7, a general Multi-Objective Evolutionary Algorithm Flow Chart is illustrated that may be followed by the hierarchical layout component placer 312 and the hierarchical multi-objective optimizer 313 to perform the processes 602-604. The MOEA Algorithm begins at block 700 and the jumps to block 701.

At block 701 an initial population of the layout solutions is created by randomly selecting the operators and operands for the polish expression of the layout. The process then goes to block 702.

At block 702, parent layout solutions are selected to reproduce a new population of layout solutions. The selection of the parent layout solution is performed by picking the layout solutions with the best fitness and best constraint measure (as described in the process 603). The process then goes to block 703.

At block 703, a new layout solution is reproduced by crossover of two layout solutions. The crossover is done by combining and mixing portions of the polish expressions of two parent layout solutions into a polish expression of a new layout solution. The process then goes to block 704.

At block 704, the new layout solution that was reproduced by the process of block 703 is mutated into a differing new solution and included in the new population of layout solutions. The mutation is performed by randomly changing the operands and/or operators in the polish expression of the layout solution. For example, in FIGS. 16A-16C, discussed previously, the operands are the layout blocks labeled A through G. The operators are the single character symbols (*+). The operators control how operands are placed relative to each other. For example, consider the polish expression (B C*A+) The portion B C* of the polish expression means that block B is placed left of block C. Continuing along the polish expression, the portion A+ there-after indicates that block A is placed on top of block B and block C. The process then goes to block 705.

At block 705, the fitness of each layout solution within the new population of layout solutions is evaluated and ranked. The layout solution is evaluated per the fitness and constraints (described in process 603). Ranking is done by sorting the layout solutions per their fitness value. The process then goes to block 706.

Then at block 706, a determination is made whether to terminate the evolution of new layout solutions or to continue generating new layout solutions. If the evolution of new layout solutions is not terminated, the process goes to block 702 and repeats the process of blocks 702-705. If the evolution of new layout solutions is to be terminated, the process goes to block 707. The evolution of new layout solutions is terminated when one of the following conditions is met: i) CPU time has exceeded a pre-set limit or ii) a new layout solution that is better than the others is not found within a given period of time.

At block 707, the pareto solution, a "shape curve", is extracted from the population of layout solutions. As discussed previously, FIG. 12 illustrates a shape curve. The process then goes to block 799 and ends.

Wire/Net Routing

Figure 8:
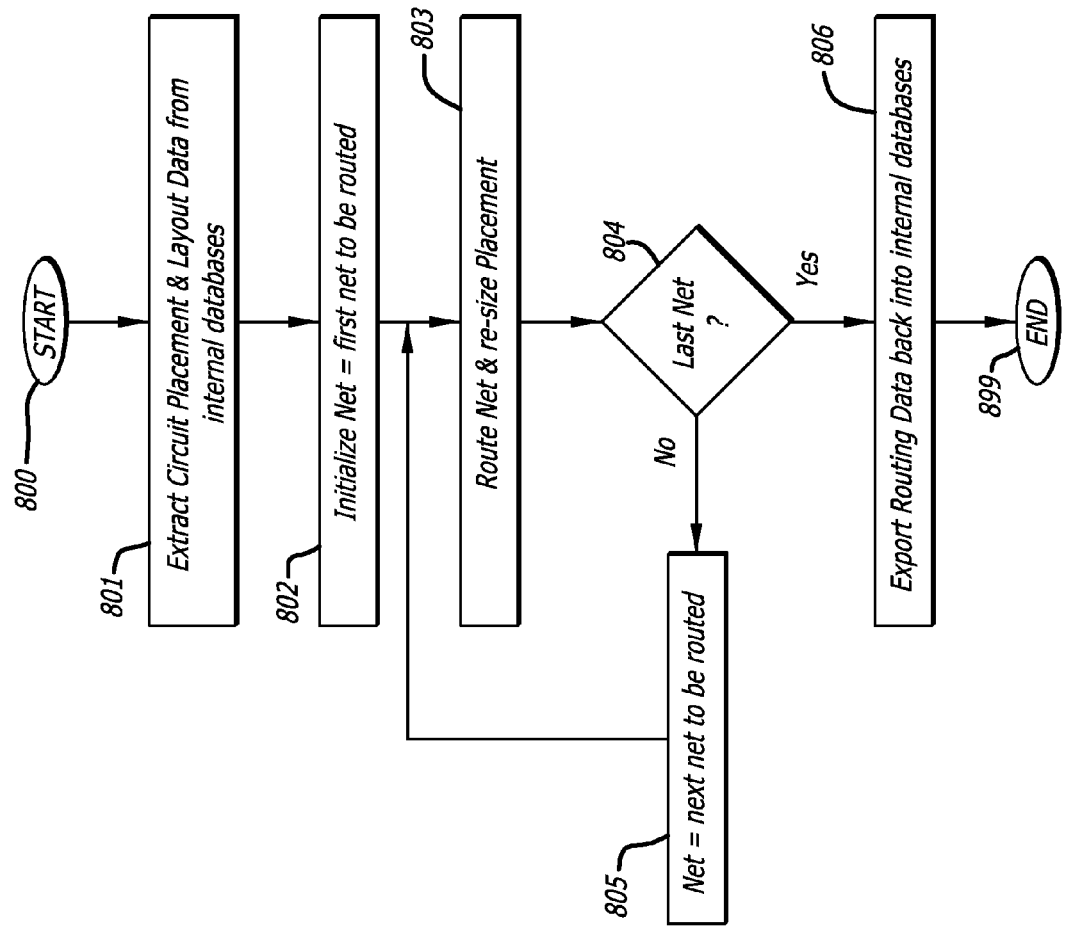
FIG. 8 is a flow chart diagram of the analog layout routing performed by the system and tool of FIG. 3.

Referring now to FIG. 8, a detailed flow chart of the circuit routing process 606 is illustrated. The process of circuit routing begins at block 800 and then goes to block 801.

At block 801, the Circuit Placement and Layout Data is extracted from the internal databases 320, 512, 610. The process then goes to block 802.

At block 802, a variable Net is initialized to be the first net that is to be routed. The process then goes to block 803.

At block 803, the given Net is routed and the placement of a device/subcircuit may be re-sized or moved concurrently with the routing. The process then goes to block 804.

At block 804, a determination is made if it is the Net just routed was the last net to be routed. If the last net was routed, the process goes to block 806. If the last net was not routed, the process goes to block 805.

At block 805, the variable Net is updated to be the next net that is to be routed. The process then goes to block 803 where the Net is routed and any re-size and re-placement concurrently occurs to complete the route.

At block 806, assuming the last net has been routed by the HALS tool 300, the routing data is exported into the internal databases 320, 512, 610. The process then goes to block 899 and the routing process ends.

Layout Selection

With the HALS tool generating multiple layout solutions, it is a challenge to communicate to a user information regarding the multiple analog circuit layout solutions. The HALS tool includes a layout selection user interface to communicate to a user information regarding the multiple analog circuit layout solutions. The layout selection user interface integrates and simplifies a user interaction with the HALS tool. The layout selection user interface offers flexibility in choosing only data of interest to a user, a view of layout implementation trade-offs, a view of layout sensitivity information, a method to compare data against each of the multiple analog layout solutions, and detailed information for the selected layout that meets designers objectives and enables design verification—layout graphical data plots (e.g., GDSII), parasitics, layout data, etc.

As mentioned previously, a hierarchical layout solutions explorer and selector user interface allows a user to browse through the plurality of layout solutions that are generated and make a selection based on certain criteria.

Figure 9:
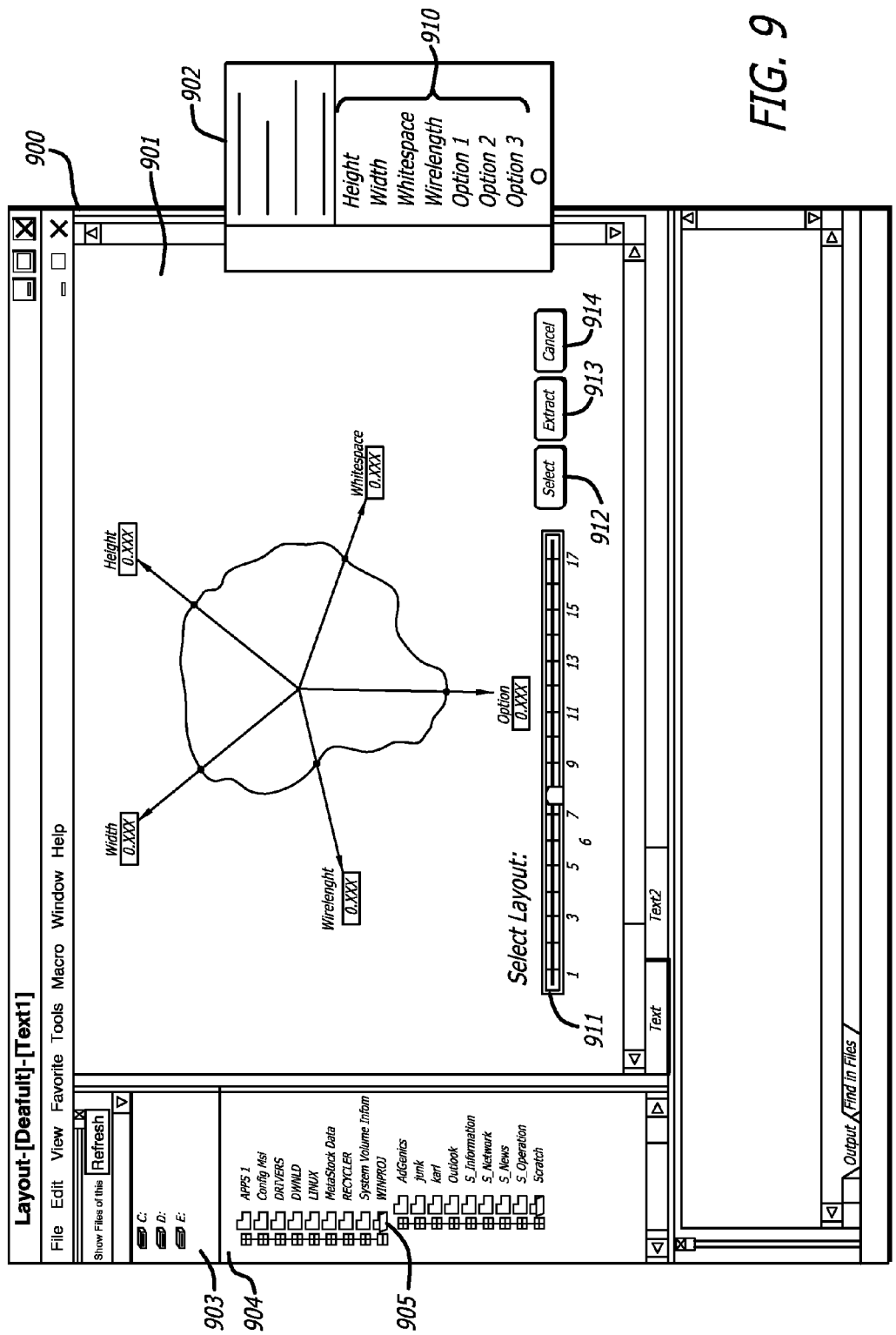
FIG. 9 is a displayed user interface on a monitor of a computer system for layout selection.

Referring now to FIG. 9, a layout selection user interface 900 of the HALS tool is displayed on a monitor of a computer system for the layout selection process by a user. The layout selection user interface 900 may also be referred to herein as a "layout selection cockpit" or a "hierarchical layout solutions explorer and selector user interface".

The layout selection user interface 900 includes a plot window 901, a menu 902, a navigation window 903 including a list of drives and folders 904. The navigation window 903 merges the directory structure, design hierarchy, and the information generated by the HALS tool 300. The organization of the navigation window 903 is more a logical organization than a physical organization so that the GDSII layout, the circuit partition, circuit netlist sections, the shape curves, logs, files, etcetera are grouped together. For example, a user may navigate to any desired level of integrated chip hierarchy from the navigation window. A design file 905 may be selected in the navigation window 903 to present layout information to a user. A user may select that a layout analysis be performed on the design file.

The menu 902 may be a pop-up menu that is selected by a mouse click, for example. The menu 902 includes a list of layout constraints that were applied to the analog circuitry for the selected level of integrated chip hierarchy. Additionally, from the menu, the user can select the type of plot window to show and select the graphs or axes to display. Furthermore, the menu 902 can allow the user to select and view the circuit netlist file, an individual gds file, and/or other information related to the selected level of design hierarchy.

The plot window 901 can display a plurality of plot types. In one embodiment of the invention, the plot window 901 displays a multiple dimension plot. In another embodiment of the invention, the plot window 901 displays one or more two dimensional (2-D) plots. In this manner, the embodiments of the invention provide a flexible method to compare and view data across a plurality of analog layout solutions.

The plot window 901 includes a sliding switch 911 to offer to display many layout solutions to a user through sliding the switch 911. That is, the sliding switch 911 is used to select the desired analog layout solution to display from the many analog layout solutions.

The plot window 901 may further include a select button 912, an extract button 913, and a cancel button 914. A user mouse clicks on the select button 912, the extract button 913, and/or the cancel button 914 to select it.

The select button 912 is used to select the analog layout solution that is desired by a user to be displayed in a layout display window. In this manner, the HALS tool offers a user an integrated environment to view and select his favorite layout solution among multiple layout solutions synthesized by the HALS tool. The cancel button 914 cancels the user selection of the analog layout solution. The extract button 913 is provided to generate and export a computer-readable file or database to a user designated area of the selected design. The exported file or database may be used with other IC design software tools to perform further analysis or to integrate the analog circuitry with other circuitry, such as digital circuitry, into a mixed signal integrated circuit, a system on a chip (SOC), for example.

The constraint menu 902 includes one or more layout constraints 910. The one or more layout constraints 910 may be standard built-in layout constraints and/or optional user defined layout constraints.

Figure 10A:
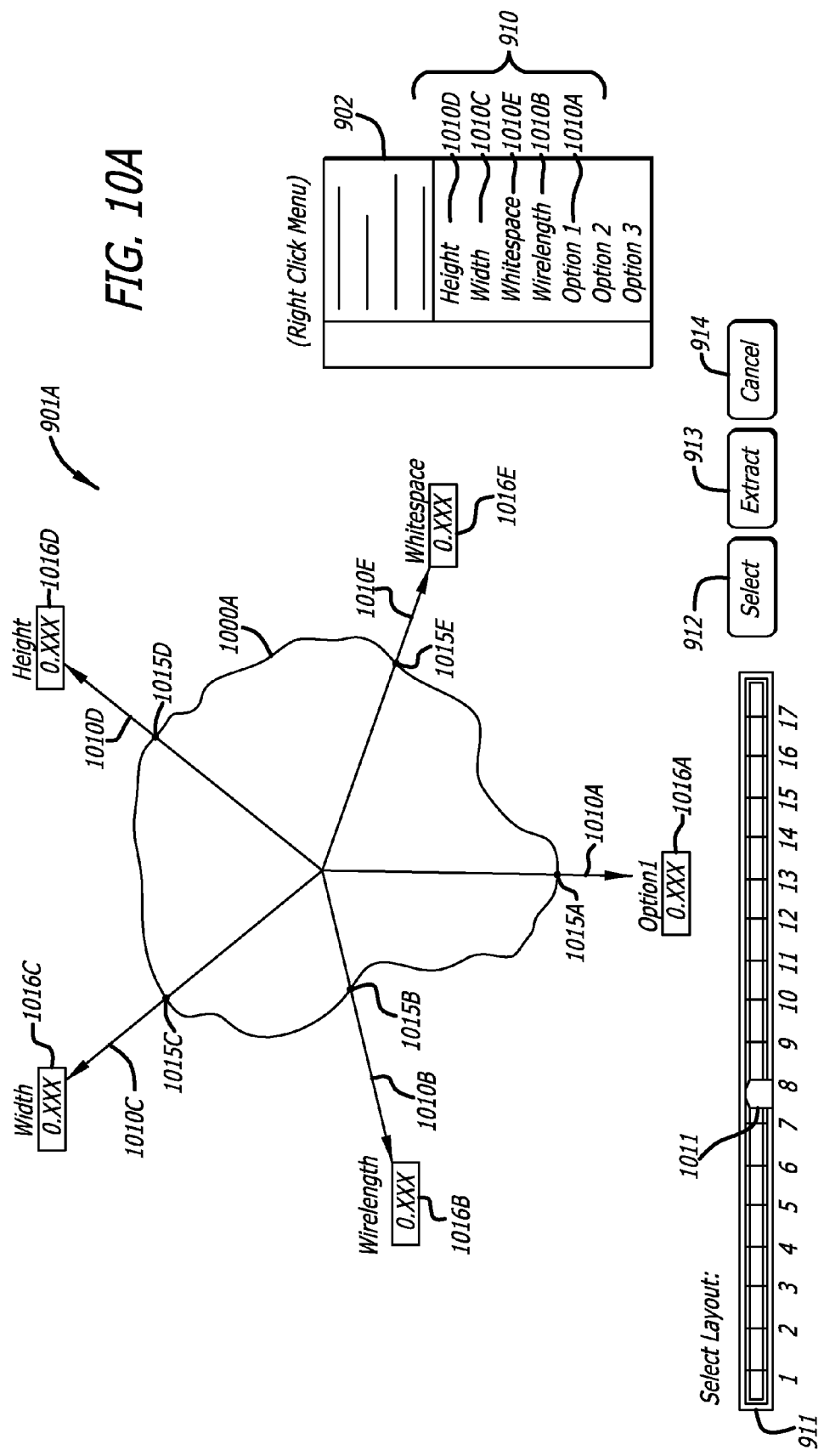
FIG. 10A illustrates a multiple dimension plot for layout selection by a user that may be displayed on a monitor within a plot window of FIG. 9.

Referring now to FIG. 10A, a multiple dimension plot window 901A is illustrated for layout selection by a user that may be displayed on a computer monitor. The multiple dimension plot window 901A includes a multidimensional plot 1000A over a plurality of layout criteria 1010A-100E. Each of the plurality of layout criteria 1010A-1010E are listed in the menu 902 which may be accessible to a user by right clicking on a mouse button. The plurality of layout criteria 1010A-1010E may include one or more options, such as option 1 1010A; minimize wire length 1010B; minimize white space 1010E; cell width 1010C; and cell height 1010D.

The plot window 901 offers many layout solutions to a user through a sliding switch 911. The sliding switch 911 is used to select the desired analog layout solution to display. For example, analog layout solution 8 is selected out of 17 possible layout solutions to generate the multidimensional plot 1000A for a given analog circuit layout in the database. As the sliding switch 911 is moved to select another desired analog layout solution, the multidimensional plot 1000A changes to display a different plot for a different analog layout solution.

The multidimensional plot 1000A illustrates how a selected analog layout solution meets each of the plurality of layout criteria 1010A-1010E. For example, in the exemplary multidimensional plot 1000A illustrated in FIG. 10A, the plot 1000A is skewed to indicate that the optional criteria 1010A is being satisfied more than the minimize wire length criteria 1010B. A user may scan through all the layout solutions to select the one that best meets a couple of the layout criteria. Alternatively, a user may scan through all the layout solutions to select one that is more centered to equally meet all the displayed criteria 1010A-1010E.

For a given selected layout solution 1011 selected by the sliding switch 911, the plot window displays maximum criteria points 1015A-1015E that are illustrated at the intersection of the plot 1000A and each of the criteria axes with respective maximum value boxes 1016A-1016E being displayed near the end of each axes.

Figure 10B:
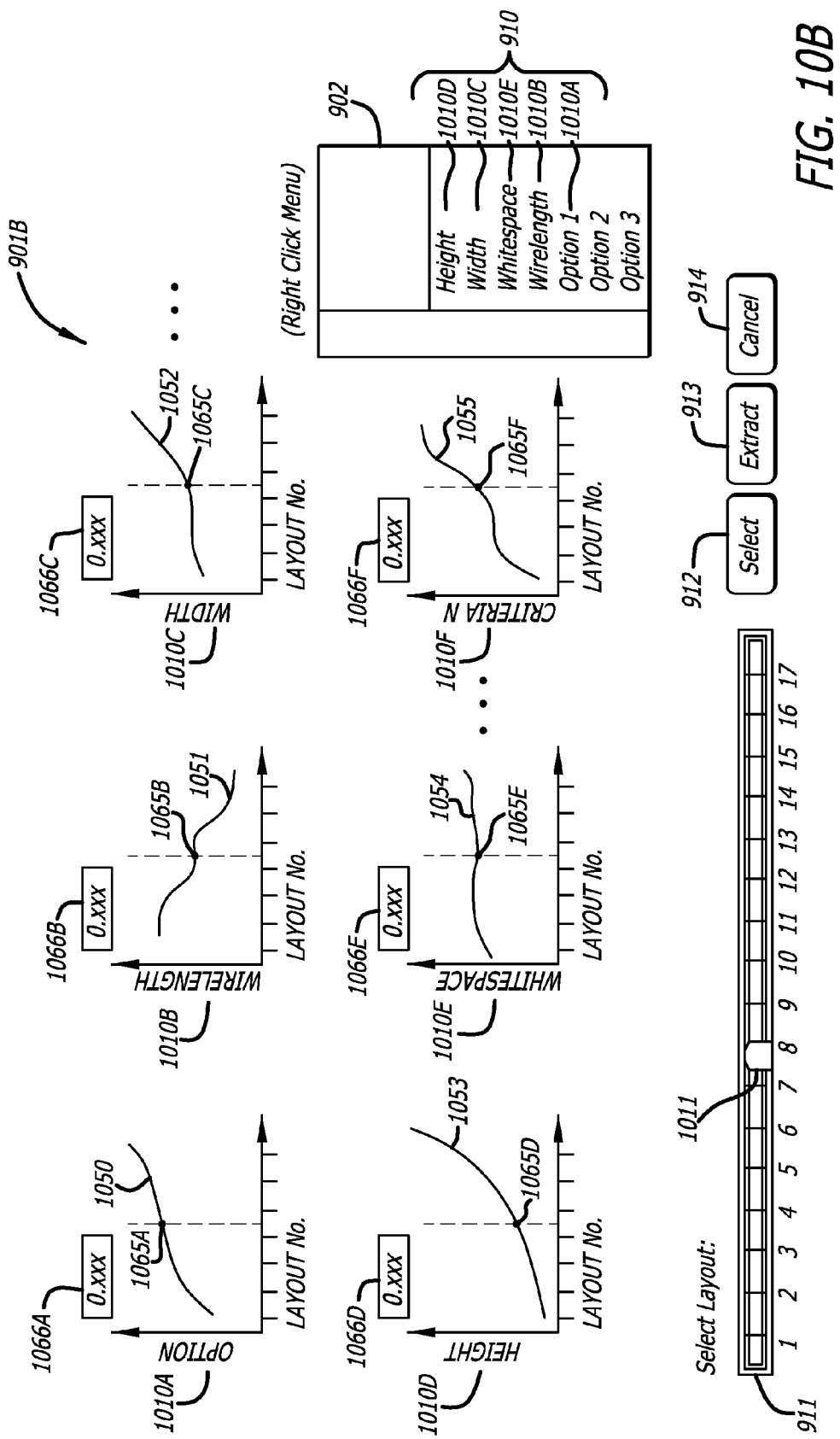
FIG. 10B illustrates a plurality of two dimension plots for layout selection by a user that may be displayed on a monitor within a plot window of FIG. 9.

Referring now to FIG. 10B, a two dimensional plot window 901B is illustrated including a plurality of two dimensional plots 1050-1055 for layout selection by a user that may be displayed on a computer monitor. Each of the plurality of two dimensional plots 1050-1055 are graphed and displayed using the layout number of the analog layout solution on the x-axis versus a given respective criteria 1010A-1010F on the y-axis. That is, each of the plurality of two dimensional plots 1050-1055 illustrates the value for the respective criteria 1010A-1010F for a plurality of analog layout solutions. In this manner, a user can readily select a layout solution that maximizes or minimizes a single or a couple of the criteria 1010A-1010F. A user may slide the sliding switch 911 to select the one analog layout solution that best meets a users goal for a couple of the layout criteria.

For a given selected layout solution 1011 selected by the sliding switch 911, the two dimensional plots 1050-1055 display criteria points 1065A-1065F with respective value boxes 1066A-1066E being displayed near the top of each y-axis. For example, selected layout number 8 may provide a relative width of 0.5 at point 1065C and a relative height of 0.2 at point 1065D. As a user slides the sliding switch 911, different values for the criteria are displayed.

A plurality of layout criteria may be used to evaluate the plurality of layout solutions, including standard built-in criteria and user customized criteria. The one or more two-dimensional plots 1050-1055 are displayed by selecting the layout criteria through the use of the menu 902.

As previously mentioned, multiple analog layout solutions may be selected by a user to have their layouts of various mask layers displayed.

FIG. 11 illustrates an exemplary schematic diagram of a comparator (COMP) 1100 to explain the plurality of layout choices that are made available to a user. The COMP 1100 is a CMOS comparator and includes p-channel transistors M2-M9; n-channel transistors M10-M11,M13-M15,M17-M22; and an inverter gate G1 coupled together as shown.

Various layout solutions for the COMP 1100 may be selected based on layout criteria previously described. For example, the layout solutions for the COMP 1100 may be selected based on the cell width and cell length of the COMP 1100.

Referring now to FIG. 12, an exemplary shape curve 1200 of a family of layout solutions made available by the embodiments of the invention for the schematic diagram of the COMP 1100 of FIG. 11 is illustrated. The legend indicates a percentage of whitespace. For example, certain points along the curve have a layout solution with 0-10% of whitespace.

Along the x-axis is the cell height of the COMP 1100. Along the y-axis is the cell width of the COMP 1100. For example, a user may select layout solutions 1201, 1202, and 1203 to have their floor-plans be displayed on a monitor to visualize their shapes for inclusion in a level of hierarchy of the integrated circuit. The user selects the desired layouts to view by pressing the select button 912 in the plot window 901.

Referring now to FIGS. 13A-13C, three exemplary floor-plans 1301-1303 corresponding to the selected layout solutions 1201-1203, respectively, are made available by the embodiments of the invention for the schematic diagram of the comparator of FIG. 11. The floor plan 1301 approximately has a cell width of 48 units and a cell height of 20 units. In one embodiment of the invention, one unit is one micron. The floor plan 1302 approximately has a cell width of 35 units and a cell height of 30 units. The floor plan 1303 approximately has a cell width of 15 units and a cell height of 70 units. These floor plans may fit in similarly shaped but scaled upper level subcircuits in the integrated circuit chip hierarchy illustrated in FIG. 2.

Figure 14A:
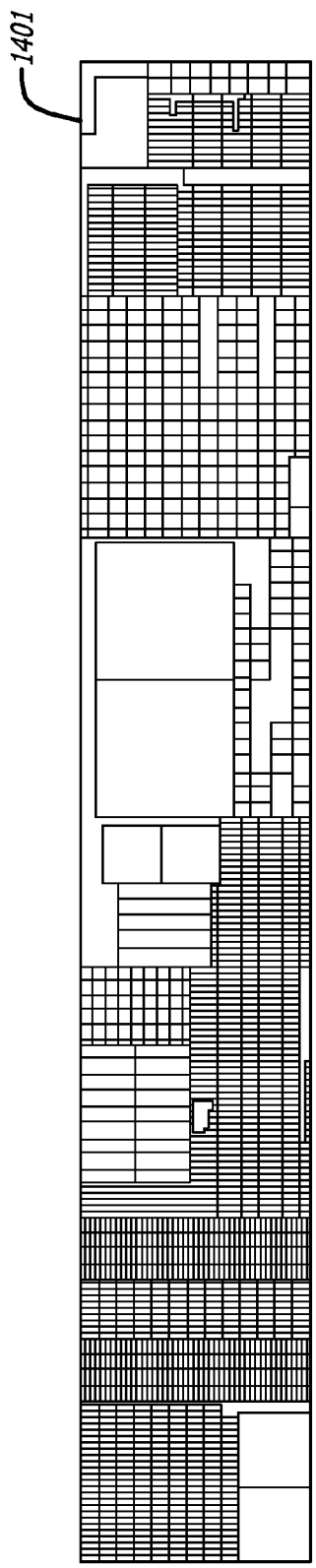
FIGS. 14A-14C illustrate three exemplary layouts out of one hundred-fifty that are made available by the embodiments of the invention for the same circuit of a filter network.
Figure 14C:
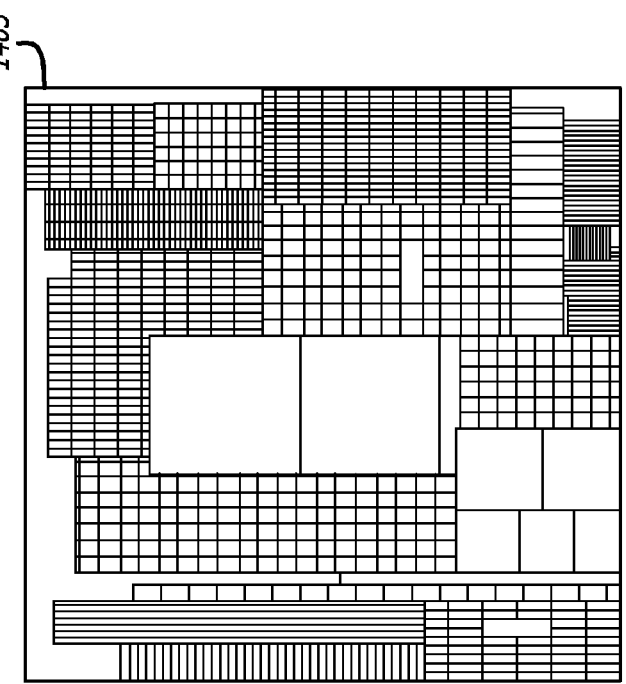
Figure 14B:
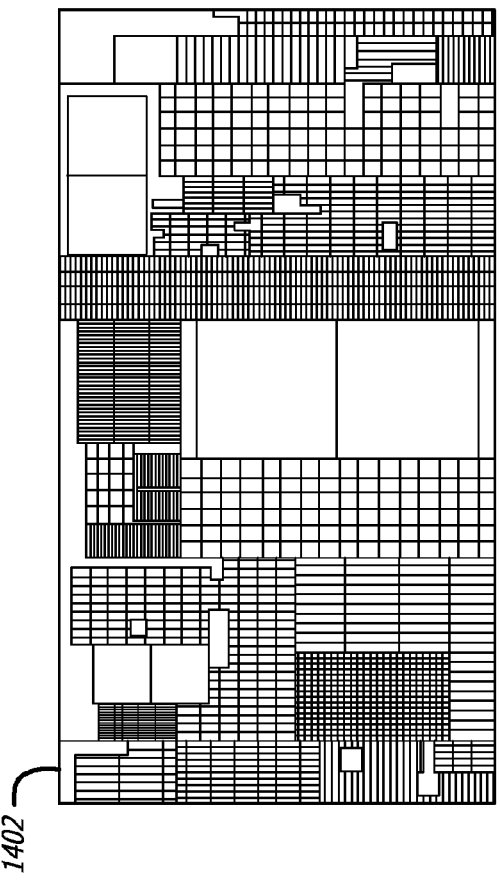

Referring now to FIGS. 14A-14C illustrate three exemplary layouts 1401-1403 out of one hundred-fifty layout solutions that were made available by the embodiments of the invention for the same subcircuit. The three exemplary layouts 1401-1403 may be a filter network. The aspect ratio of the subcircuit height and subcircuit width of the subcircuit layouts 1401-1403 is respectively similar to the aspect ratio of the cell height and cell width of the floor plans 1301-1303 of the standard cell of the comparator 1100.

Computer System

Referring now to FIG. 15, a computing system 1500 is illustrated that may be used to perform some or all of the processes in accordance with a number of embodiments of the invention. In one embodiment of the invention, the computing system 1500 includes a processor 1510, a memory 1520, a removable media drive 1530, and a hard disk drive 1540. In one embodiment, the processor 1510 executes instructions residing on a machine-readable medium, such as the hard disk drive 1540, a removable medium 1501 (e.g., an optical medium (compact disk (CD), digital video disk (DVD), etc.), a magnetic medium (magnetic disk, a magnetic tape, etc.), or a combination of both. The instructions may be loaded from the machine-readable medium into the memory 1520, which may include Random Access Memory (RAM), dynamic RAM (DRAM), etc. The processor 1510 may retrieve the instructions from the memory 1520 and execute the instructions to perform the operations described above.

Note that any or all of the components and the associated hardware illustrated in FIG. 15 may be used in various embodiments of the system 1500. However, it should be appreciated that other configurations of the system 1500 may include more or less devices than those shown in FIG. 15.

Some portions of the preceding detailed description have been presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The embodiments of the invention also relate to an apparatus for performing the operations described herein. This apparatus may be specially constructed for the required purposes, or it may comprise a general-purpose computer selectively activated or reconfigured by a computer program stored in the computer. Such a computer program may be stored in a computer readable storage medium, a processor readable medium, a machine-readable medium, or any other mechanism or medium for storing or transmitting information in a form readable by a machine (e.g., a computer), such as, but is not limited to, any type of disk including magnetic disk storage media; optical storage media; floppy disks, optical disks, CD-ROMs, and magnetic-optical disks, read-only memories (ROMs), random access memories (RAMs), EPROMs, EEPROMs, flash memory devices, magnetic or optical cards, or any type of media suitable for storing electronic instructions, and each of which may be coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the operations described. The required structure for a variety of these systems will appear from the description below. In addition, the embodiments of the invention are not described with reference to any particular programming language. It will be appreciated that a variety of programming languages may be used to implement the teachings of the invention as described herein.

CONCLUSION

The hierarchical analog layout synthesizer can synthesize the physical layout design of analog very large scale integrated (VLSI) circuits with a layout quality similar to that done manually by a human and is much faster to obtain the result.

The hierarchical analog layout synthesizer performs a hierarchical synthesis & optimization of the layout by applying multi-objective constrained optimization to find a family of layout (partition & placement) solutions at each level of hierarchy. It applies a "layout pareto front" as means to pass layout performance characteristics from the bottom-up and as a means to make global layout optimization from the top-down.

The hierarchical analog layout synthesizer provides an integrated Multi-step Partition, Placement & Routing at each level of hierarchy, applying a multi-objective constrained optimization for device partitioning, applying a multi-objective constrained optimization for device placement, and applying a sequential routing with integrated placement resizing.

The embodiments of the invention, when implemented in software, include elements that are essentially the code segments to automatically perform the necessary tasks. The program or code segments can be stored in a processor readable medium or transmitted by a computer data signal embodied in a carrier wave over a transmission medium or communication link. The program or code segments may be downloaded via computer networks such as the Internet, Intranet, etc.

The embodiments of the invention are thus described. While certain exemplary embodiments have been described and shown in the accompanying drawings, it is to be understood that such embodiments are merely illustrative and not restrictive on the broad invention, and that the embodiments of the invention not be limited to the specific constructions and arrangements shown and described, since various other modifications may occur to those ordinarily skilled in the art.

What is claimed is:

1. A method of synthesizing a physical layout of an integrated circuit chip including analog circuitry, the method comprising:
   receiving a circuit netlist of the integrated circuit chip including analog circuitry;
   representing and manipulating a hierarchical analog circuit layout including device placement and net routing in response to the circuit netlist, the hierarchical analog circuit layout including a plurality of levels of layout hierarchy;
   passing physical layout information from one level of the layout hierarchy to an adjacent level of the layout hierarchy to synthesize the physical layout of the integrated circuit chip, wherein the physical layout includes a plurality of mask layers to manufacture the integrated circuit chip; and
   wherein the receiving, the representing and manipulating, and the passing are performed with a processor.

2. The method of claim 1, further comprising:
   receiving a plurality of analog layout constraints and a plurality of analog layout performance requirements for laying out the integrated circuit chip, and
   converting the circuit netlist, the plurality of analog layout constraints, and the plurality of analog layout performance requirements into a layout database.

3. The method of claim 1, further comprising:
   receiving a plurality of analog layout constraints and a plurality of analog layout performance requirements for laying out the integrated circuit chip, and
   performing a constrained multi-objective optimization on the device placement and the net routing at a given level of the layout hierarchy in response to the plurality of analog layout constraints and the plurality of analog layout performance requirements.

4. The method of claim 3, further comprising:
   performing a global layout optimization over all levels of the layout hierarchy of the integrated circuit chip in response to the plurality of analog layout constraints and the plurality of analog layout performance requirements.

5. The method of claim 1, further comprising:
   receiving a plurality of analog layout constraints and a plurality of analog layout performance requirements for laying out the integrated circuit chip, and
   performing a global layout optimization over all levels of the layout hierarchy of the integrated circuit chip in response to the plurality of analog layout constraints and the plurality of analog layout performance requirements.

6. An apparatus for synthesizing a physical layout of an integrated circuit chip including analog circuitry, the apparatus comprising:
   means to receive a circuit netlist, physical layout constraints, and physical layout performance requirements;
   means to represent and manipulate a hierarchical layout of the integrated circuit chip in response to the circuit netlist, the hierarchical layout including a plurality of levels of layout hierarchy, the means to represent and manipulate including a means to perform device placement and net routing; and
   means to pass physical layout information from one level of the layout hierarchy to an adjacent level of the layout hierarchy, wherein the physical layout includes a plurality of mask layers to manufacture the integrated circuit chip.

7. The apparatus of claim 6, further comprising:
   means to convert the circuit netlist, the layout constraints, the layout performance requirements into a layout database.

8. The apparatus of claim 6, further comprising:
   means to perform a constrained multi-objective optimization on the device placement and the net routing at a given level of the layout hierarchy in response to the circuit netlist, the layout constraints, and the layout performance requirements; and
   means to perform a global layout optimization in response to the circuit netlist, the layout constraints, and the layout performance requirements.

9. A hierarchical analog layout synthesis tool for synthesizing a physical layout including a plurality of mask layers to manufacture an analog integrated circuit, the hierarchical analog layout synthesis tool comprising:
   a user interface and data input reader;
   a hierarchical layout component placer in communication with the user interface and data input reader;
   a hierarchical multi-objective optimizer in communication with the hierarchical layout component placer, the hierarchical layout component placer and the hierarchical multi-objective optimizer to generate a plurality of layout placements in a database;
   a hierarchical layout component router in communication with the database, the hierarchical layout component router to generate a plurality of layout solutions for an analog integrated circuit in response to the plurality of layout placements; and
   a hierarchical layout solutions explorer and selector user interface in communication with the database, the hierarchical layout solutions explorer and selector user interface to read the plurality of layout solutions and present them to a user for selection of a desired layout solution for the analog integrated circuit.

10. The hierarchical analog layout synthesis tool of claim 9, wherein
    the hierarchical layout component placer and the hierarchical multi-objective optimizer use a multi-objective optimization algorithm to generate the plurality of layout placements in the database.

11. The hierarchical analog layout synthesis tool of claim 10, wherein
    the multi-objective optimization algorithm is a multi-objective evolutionary algorithm.

12. The hierarchical analog layout synthesis tool of claim 9, wherein
    elements of the hierarchical analog layout synthesis tool are software modules including instructions executable by a processor.

13. A hierarchical analog layout synthesis tool for synthesizing a physical layout including a plurality of mask layers to manufacture an analog integrated circuit, the hierarchical analog layout synthesis tool comprising:
    a hierarchical layout component placer to receive a circuit netlist and to generate an initial placement of analog circuit components;

a hierarchical multi-objective optimizer in communication with the hierarchical layout component placer, the hierarchical layout component placer and the hierarchical multi-objective optimizer to generate a plurality of layout placements in a database using a multi-objective optimization algorithm in response to the initial placement of analog circuit components;

a hierarchical layout component router in communication with the database to generate a plurality of layout solutions for an analog integrated circuit in response to the plurality of layout placements; and a user interface in communication with the database and the hierarchical layout component placer, the user interface to receive the circuit netlist and layout synthesis directives and specifications and to provide a hierarchical layout solutions explorer and selector user interface to read the plurality of layout solutions and present them to a user for selection of a desired layout solution for the analog integrated circuit.

14. The hierarchical analog layout synthesis tool of claim 13, wherein
the multi-objective optimization algorithm is a multi-objective evolutionary algorithm.

15. The hierarchical analog layout synthesis tool of claim 13, wherein
elements of the hierarchical analog layout synthesis tool are software modules including instructions executable by a processor.

* * * * *